(12) United States Patent
Takeuchi et al.

(10) Patent No.: US 8,622,755 B2
(45) Date of Patent: Jan. 7, 2014

(54) CONNECTOR COVER AND JUNCTION BOX UNIT PROVIDED WITH THE SAME

(75) Inventors: Kunihiko Takeuchi, Kakegawa (JP); Fumiyoshi Ohashi, Kakegawa (JP)

(73) Assignee: Yazaki Corporation, Tokyo (JP)

(*) Notice: Subject to any disclaimer, the term of this patent is extended or adjusted under 35 U.S.C. 154(b) by 155 days.

(21) Appl. No.: 13/067,924

(22) Filed: Jul. 7, 2011

(65) Prior Publication Data

US 2012/0006594 A1      Jan. 12, 2012

(30) Foreign Application Priority Data

Jul. 8, 2010  (JP) ................... 2010-155425

(51) Int. Cl.
 *H05K 5/03*       (2006.01)
(52) U.S. Cl.
 USPC .................. 439/76.2; 439/76.1; 439/535
(58) Field of Classification Search
 USPC ................. 174/50, 520; 439/76.1, 76.2, 535
 See application file for complete search history.

(56) References Cited

U.S. PATENT DOCUMENTS

| | | | | |
|---|---|---|---|---|
| 5,980,297 A * | 11/1999 | Sugie | | 439/354 |
| 6,579,113 B2 * | 6/2003 | Kodama | | 439/358 |
| 6,696,640 B1 * | 2/2004 | Castellani et al. | | 174/483 |
| 6,786,740 B2 * | 9/2004 | Ito | | 439/76.2 |
| 7,699,623 B2 * | 4/2010 | Yoshida et al. | | 439/76.2 |
| 7,785,116 B2 * | 8/2010 | Akahori et al. | | 439/76.2 |
| 2010/0112831 A1 * | 5/2010 | Asada | | 439/76.2 |

FOREIGN PATENT DOCUMENTS

| | | |
|---|---|---|
| JP | 2001-339824 A | 12/2001 |
| JP | 2005-051912 A | 2/2005 |

\* cited by examiner

*Primary Examiner* — Timothy J Thompson
*Assistant Examiner* — Pete Lee
(74) *Attorney, Agent, or Firm* — Edwards Wildman Palmer LLP

(57) ABSTRACT

There is provided a junction box unit that comprises a body to which a power integration unit is attached and a connector cover that positions a connector of a wiring harness with respect to the body. The connector cover comprises a holding portion holding the connector, a mounting portion attached to the body, and a main body to be accommodated therein. The mounting portion comprises an engagement projection and an engagement arm. The engagement projection protrudes from one end of the main body for locking engagement with a locking portion of the junction box body. The engagement arm includes an arm main body having one end continuing to an outer surface of the other end of the main body and a free end. A protrusion is provided at the central portion of the arm main body for locking engagement with the locking portion. When the protrusion is in locking engagement with the locking portion, the other end of the arm main body is positioned more outwardly of the body than the locking portion.

8 Claims, 6 Drawing Sheets

CONNECTOR COVER AND JUNCTION BOX UNIT PROVIDED WITH THE SAME

CROSS-REFERENCE TO RELATED APPLICATION

The Japan Patent Application No. 2010-155425 upon which this patent application is based is incorporated by reference herein.

BACKGROUND OF THE INVENTION

1. Field of the Invention

The present invention relates to a connector cover adapted to be attached to an electrical junction box mounted in automobile or other vehicles, and to a junction box unit provided with the same connector cover.

2. Description of the Related Art

Automobiles or other vehicles generally incorporate various electrical and electronic components including lamps such as a headlight and a taillight, electrical motors such as a starter motor and a motor for an air conditioning unit.

In order to power or provide electricity to these electrical or electronic components, junction blocks are provided at predetermined locations in the automobiles. The junction block integrates a set of electrical circuit units including a number of fuses and relays.

Since the junction block may comprise fuses, relays, and busbars, it may be referred to as a fuse block, a relay box, or more generically an electrical junction box. Also, in this document, the fuse blocks, relay boxes, and junction blocks are generically referred to as the electrical junction box.

The electrical junction box comprises a body defining its outer shape and a busbar provided inside of the body. The electric or electronic components such as relays, fuses, and a power integration unit incorporating the relays and fuses are mounted to the body.

A connector of a wiring harness is connected to a lower surface of the body, the connectors being connected to various electronic components mounted in the automobile. A power cable that is connected to a battery or a generator is also connected to the body.

The body includes a space defined such that the power integration unit is accommodated therein. Provided in this space is a securing element adapted to secure the power integration unit. Also, other connectors of the wiring harness are connected to a lower surface of the power integration unit.

The busbar is adapted to electrically connect the power cable, electric components such as the fuses, relays, and power integration unit, and terminals of the connectors of the wiring harness, and the various electronic components to each other in accordance with predetermined patterns.

Electricity from a power source is fed to the electrical junction box via the power cable, and the electrical junction box distributes the electricity among the various electronic components via the fuses, relays, and power integration unit and via the electrical wires of the wiring harness or harnesses.

A power integration unit serving as one of the electric components may be attached to the above sate of the art electrical junction box on an automotive assembly line. In such a case, the junction box unit, which is in a state where electric components other than the power integration unit and the connectors of the wiring harness are attached to the body, is conveyed to the automotive assembly line, the connectors of a desired wiring harness or harnesses are connected to the power integration unit on the automotive assembly line, and then the power integration unit is attached to the body, and thus the electrical junction box is assembled into a finished product.

The connector that has to be attached to the power integration unit may reside deep inside of or at the bottom of the electrical junction box, causing difficulty in pulling it out of the junction box. Further, the connectors of the wiring harness are connected to a large number of the terminals of the electrical wires. As a result, the electrical wires may get tangled with each other while the connectors that are to be attached to the power integration unit are accommodated in the body, and in the automotive assembly line, which hinders smooth mounting of the power integration unit to the electrical junction box.

In order to address this problem, the inventor of the present invention advocates a connector cover configured to hold the connectors, provisionally secured to the section of the body where the power integration unit is mounted, and previously position the connectors to be attached to the power integration unit, the positioning being defined with respect to the body. The connectors cover of this type need to be readily detachable from the body in order to facilitate mounting of the power integration unit on the automotive assembly line.

SUMMARY OF THE INVENTION

In view of the above, it is an object of the present invention to provide a connector cover that is readily detachable from the body and to provide a junction box unit that includes the same connector cover.

In order to attain the above objective, a first aspect of the present invention provides a connector cover that comprises (A) a main body sized and dimensioned to be accommodated in a body of an electrical junction box; (B) a holding portion configured to hold a connector of a wiring harness; and (C) a mounting portion configured to be attached to the body of the electrical junction box for mounting of the main body thereto. The connector cover is used to provide positioning of the connector of the wiring harness with respect to the body of the electrical junction box.

The mounting portion comprises (a) an engagement projection protruding from an outer surface of one end of the main body and configured to be brought into locking engagement with a locking portion provided on the body of the electrical junction box, the locking portion being configured to secure an electric component intended to be accommodated in the body of the electrical junction box, and (b) an engagement arm.

The engagement arm comprises (i) an arm main body having one end and an other end, the one end continuing to an outer surface of an other end of the main body and the other end being a free end, and (ii) a protrusion provided at a central portion of the arm main body and configured to be brought into locking engagement with the locking portion of the body of the electrical junction box.

In a state where the protrusion is in locking engagement with the locking portion, the other end of the arm main body is positioned more outwardly of the body than the locking portion.

Preferably, the connector cover further comprises a positioning rib protruding from the outer surface of the one end of the main body, extending lengthwise of the engagement arm, the positioning rib including a reduced portion whose degree of protrusion decreases as the reduced portion becomes more spaced from the holding portion.

Preferably, the connector cover comprises a pair of the positioning ribs such that the engagement projection is provided therebetween.

Another aspect of the present invention provides a junction box unit that comprises (a) a body of an electrical junction box to which an electric component is attached; and (b) the connector cover having the above-described configuration and configured to be attached to the body and provide positioning of a connector of a wiring harness with respect to the body.

The connector cover of the present invention includes, but not limited to, the following advantageous effects.

Since the mounting portion includes the engagement projection and the engagement arm whose other end is positioned more outwardly of the body than the locking portion, the other end of the engagement arm can be readily moved such that the engagement arm can is taken out of locking engagement with the locking portion, allowing the connector cover to be readily detached from the body.

Also, by virtue of the positioning of the connector cover can be achieved with respect to the body. Also, since the positioning rib includes the reduced portion, the positioning rib is protected against being caught by the body as the locking engagement with the by the engagement arm is exited and the connector cover is detached from the body. It is appreciated that the connector cover is allowed to be readily and reliably detached from the body.

In addition, by virtue of the pair of the positioning ribs and the engagement projection provided therebetween, accurate positioning of the connector cover is achieved with respect to the body.

Other objects, features, and advantages of the present invention will be apparent in view of this disclosure to those skilled in the art.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF THE EXEMPLARY EMBODIMENT

The connector cover and junction box unit according to one exemplary embodiment of the present invention is described with reference to FIGS. 1 to 12.

Figure 1:
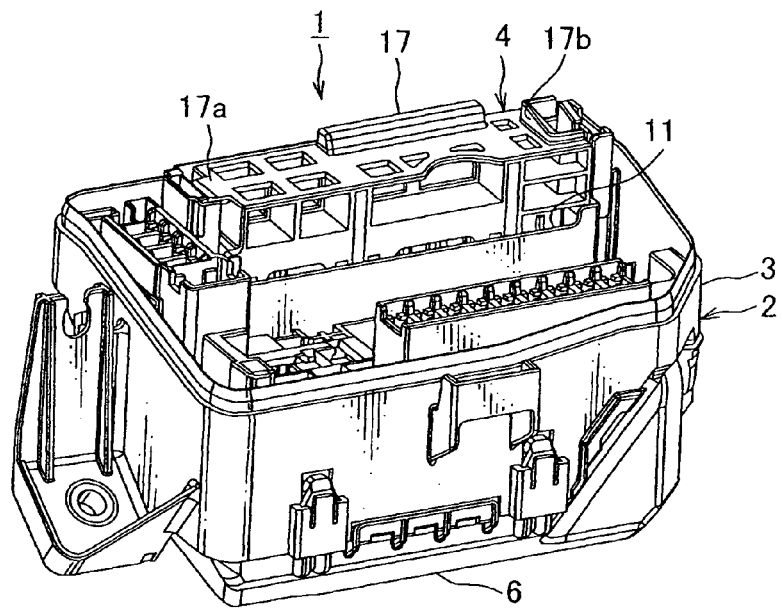
FIG. 1 is a perspective view of a junction box unit according to one embodiment of the present invention.
Figure 2:
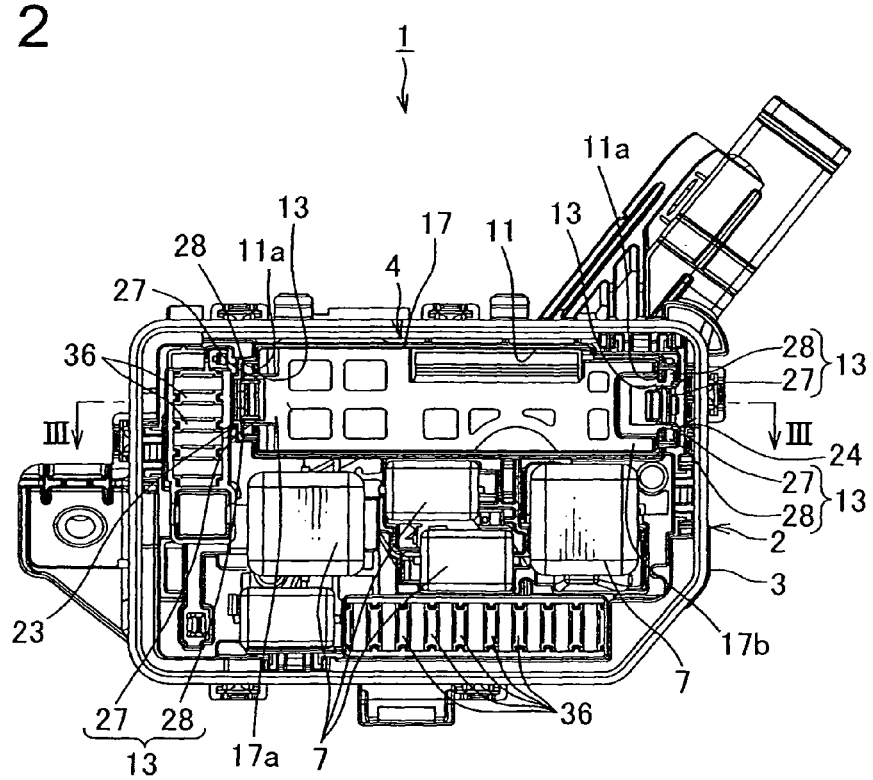
FIG. 2 is a plan view of the junction box unit illustrated in FIG. 1.
Figure 3:
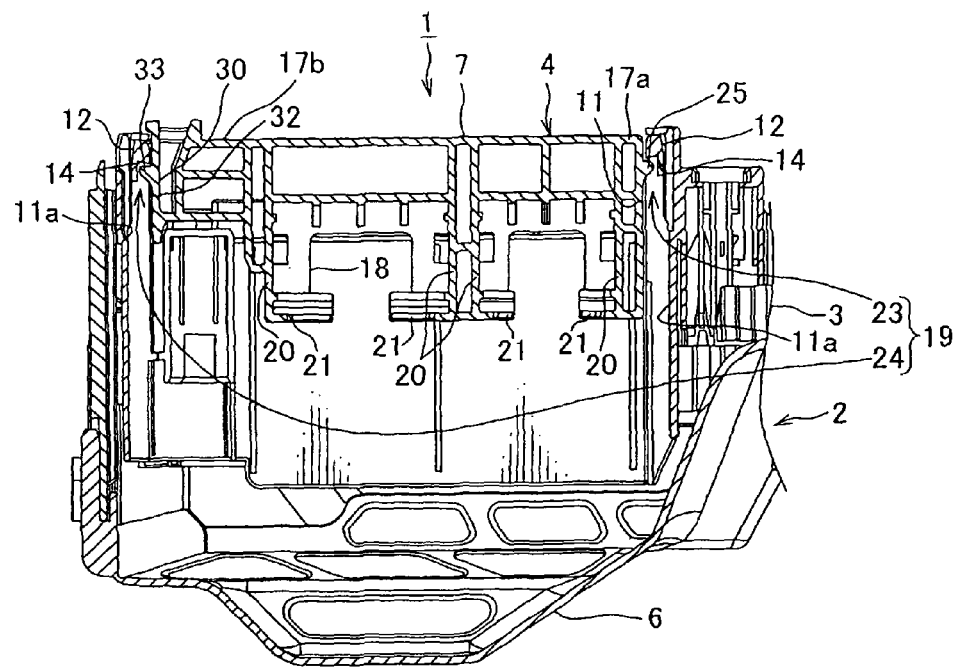
FIG. 3 is a cross-sectional view taken along the line III-III in FIG. 2.

With reference to FIGS. 1 to 3, there is shown a junction box unit 1 that comprises an electrical junction box 2 having a body 3 and a connector cover 4.

The electrical junction box 2 is adapted to be mounted in automobile or other vehicles. The electrical junction box 2 comprises the body 3 (illustrated in FIG. 4), a power integration unit 5 serving as an electric component (illustrated in FIG. 11), a not-shown upper cover, and a lower cover 6 (illustrated in FIG. 9).

Figure 4:
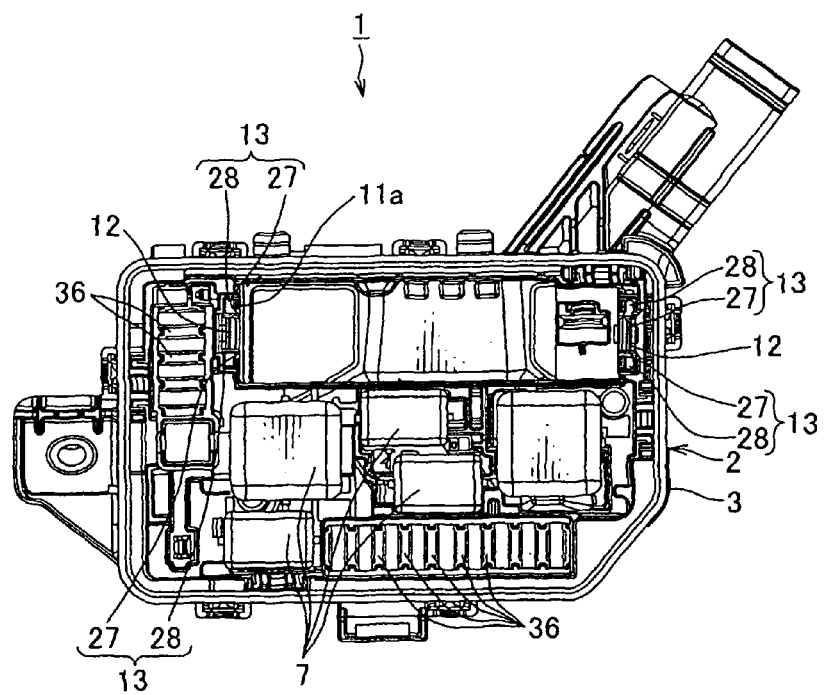
FIG. 4 is a plan view of a body of the junction box unit illustrated in FIG. 1.
Figure 10:
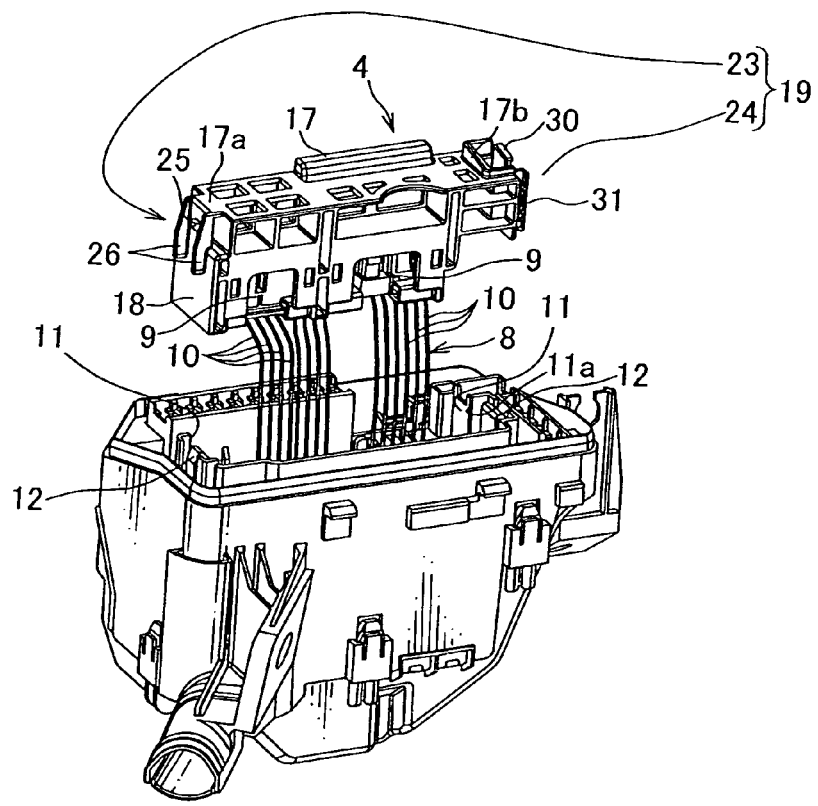
FIG. 10 is a perspective view of the junction box unit illustrated in FIG. 9 in which the connector cover is detached therefrom.

Referring to FIGS. 2 and 4, the body 3 has a rectangular shape in plan view. Various electric components such as a relay 7 (illustrated in FIG. 2) and a fuse 36 (illustrated in FIG. 2) are attached to the body 3 at an upper surface thereof. The upper surface of the body 3 is illustrated in an upper portion of FIG. 1. Also, a connector 9 (as illustrated in FIG. 10) of an automotive wiring harness 8 (shown partly in FIG. 10) is connected to the body 3 at a lower surface thereof. The lower surface is illustrated in a lower portion of FIG. 1.

The wiring harness 8 includes a plurality of electrical wires 10 (shown partly in FIG. 10) and a plurality of the connectors 9 (shown partly in FIG. 10) each attached to a group of ends of the electrical wires 10. Some of the connectors 9 are adapted to be connected to the various electronic components incorporated in the automobile, while the other thereof are connected to the lower surface of the body 3, and remaining two connectors are connected to a lower surface of the power integration unit 5. The lower surface of the power integration unit 5 is illustrated in a lower portion of FIG. 11.

Referring to FIG. 4, the body 3 includes a component accommodation portion 11. The component accommodation portion 11 is provided near an edge of the body 3 such that the component accommodation portion 11 defines a space extending through the body 3 in a direction in which the upper and lower surfaces are opposed to each other.

The component accommodation portion 11 has a rectangular shape in plan view. A length direction in a planar dimension of the accommodation portion 11 is parallel to a length direction in a planar dimension of the body 3. The component accommodation portion 11 has two inner surfaces 11a opposed to each other in the length direction, and the inner surfaces 11a each include a locking arm 12 (serving as a locking portion in the context of the scope of protection of the present invention) and a pair of positioning grooves 13.

The locking arm 12 in its literal sense takes a shape of an arm and includes one end continuing to the edge of the inner surface 11a at the lower side and the other end residing at the upper side and provided as a free end. A throughhole 14 is provided at the centre of the locking arm 12 over a substantially full length of the locking arm 12. A later-described engagement projection 15 of the power integration unit 5 enters the throughhole 14 such that the engagement projection 15 is caught by the above-described other end, so that the engagement projection 15 of the power integration unit 5 is brought into locking engagement with the locking arm 12. By virtue of the locking engagement with the engagement projection 15, the locking arm 12 secures the power integration unit 5 to the body 3 in a state where the power integration unit 5 is accommodated in the component accommodation portion 11.

The positioning grooves 13 are provided in a shape of a recess on the inner surface 11a such that the locking arm 12 is positioned therebetween. Also, a length direction of the positioning groove 13 is parallel to a length direction of the locking arm 12. As illustrated in FIG. 4, the pair of positioning grooves 13 each include parallel portions 27 provided in a shape of a recess on the inner surface 11a and parallel to each other, and spaced-apart portions 28 continuing to the parallel portions 27 and extending in a direction away from each other.

Also, a terminal fitting attached to an end of the power cable connected to a power source such as a battery and a generator is attached to the body 3.

A not-shown busbar is provided inside of the body 3. The busbar is obtained by punching and bending of a conductive metal plate. The busbar is adapted to electrically connect the relay 7 and fuse 36 attached to the upper surface of the body 3, the terminals of the connectors 9 of the wiring harness 8 attached to the lower surface thereof, the terminal fitting attached to the end of the power cable, and the power integration unit 5 to each other in accordance with a predetermined pattern.

Figure 11:
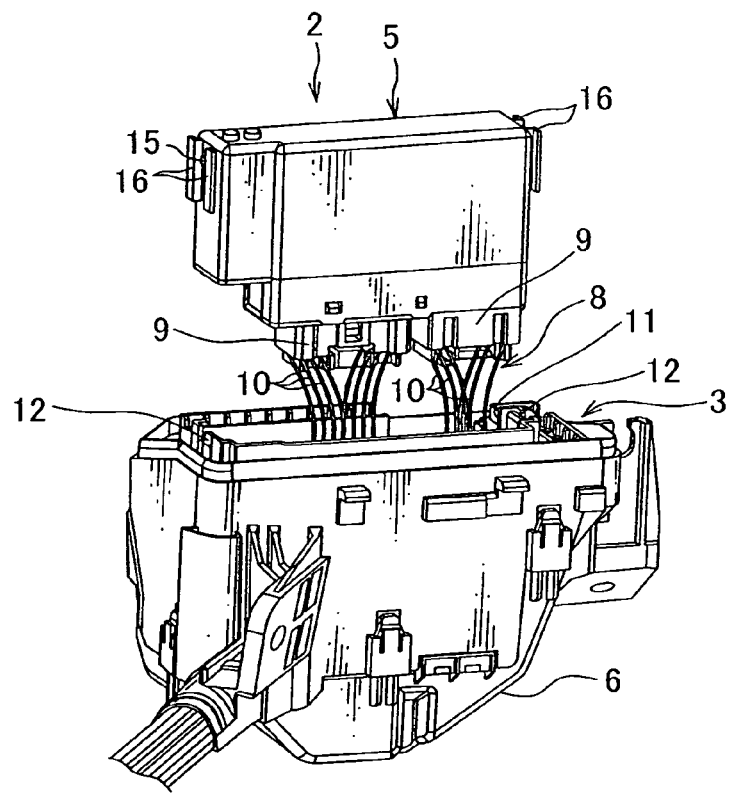
FIG. 11 is a perspective view of illustrated of the connector cover illustrated in FIG. 10 in which the connector of a wiring harness detached from the connector cover is attached to the power integration unit.

As illustrated in FIG. 11, the power integration unit 5 has an external appearance of a flat box sized and dimensioned to be accommodated in the component accommodation portion 11. The power integration unit 5 accommodates therein a circuit board incorporating thereupon the relays and fuses.

The connector 9 of the wiring harness 8 is connected to the lower surface of the power integration unit 5, the lower surface being illustrated in the lower portion of FIG. 11. The terminal of the connector 9 is connected to the circuit board residing in the power integration unit 5.

Electrical power from the power source is fed to the circuit board via the busbar disposed within the body 3. Also, the power integration unit 5 includes engagement projections 15 on the both ends thereof in its length direction, the engagement projections 15 taking a shape of a projection and sized and dimensioned to be brought into locking engagement with the locking arm 12; and a rib 16 sized and dimensioned to enter the positioning groove 13.

The power integration unit 5 is inserted into the component accommodation portion 11 in a state where the connector 9 of the wiring harness 8 is connected to the lower surface of the power integration unit 5. In this manner, the power integration unit 5 is accommodated in the body 3 with the engagement projection 15 brought into locking engagement with the locking arm 12.

The upper cover is made of insulating synthetic resin and configured to be attached to the body 3 such that the top surface of the body 3 is covered by the upper cover. The lower cover is made of insulating synthetic resin and configured to be attached to the body 3 such that the lower surface of the body 3 is covered by the lower cover.

The electrical junction box 2 having the above-described configuration supplies part of the electricity from the power cable via the relay 7, fuse 36, and the fuses and relays in the power integration unit 5, and by way of the wiring harness 8, to the electronic components incorporated in the automobile.

The connector cover 4 is adapted and configured to provide positioning of the connector 9 of the wiring harness 8 attached to the power integration unit 5, the positioning being provided relative to the body 3 to which the power integration unit 5 is yet to be attached.

The connector cover 4 is made of insulating synthetic resin and in a shape of a flat box with size and dimensions that allow the connector over 11 to be accommodated in the component accommodation portion 11.

Figure 5:
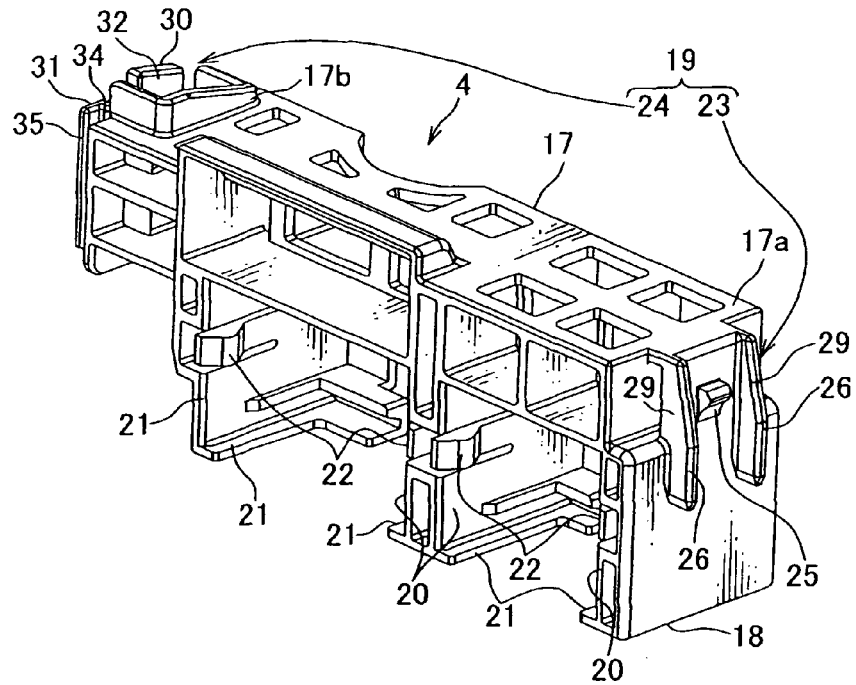
FIG. 5 is a perspective view of a connector cover of the junction box unit illustrated in FIG. 1.
Figure 6:
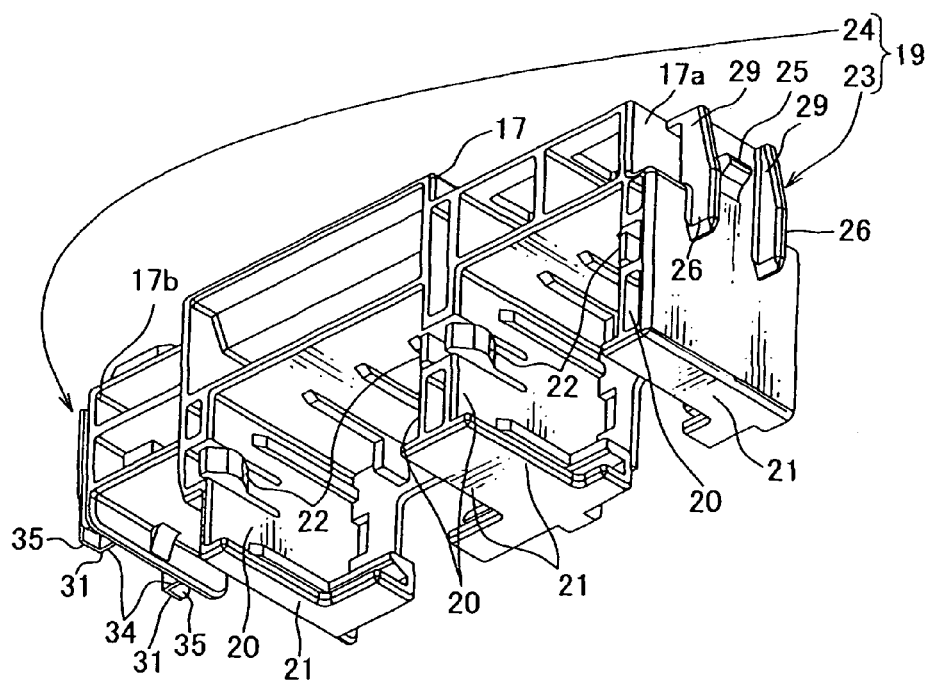
FIG. 6 is a perspective view of the connector cover illustrated in FIG. 5.
Figure 7:
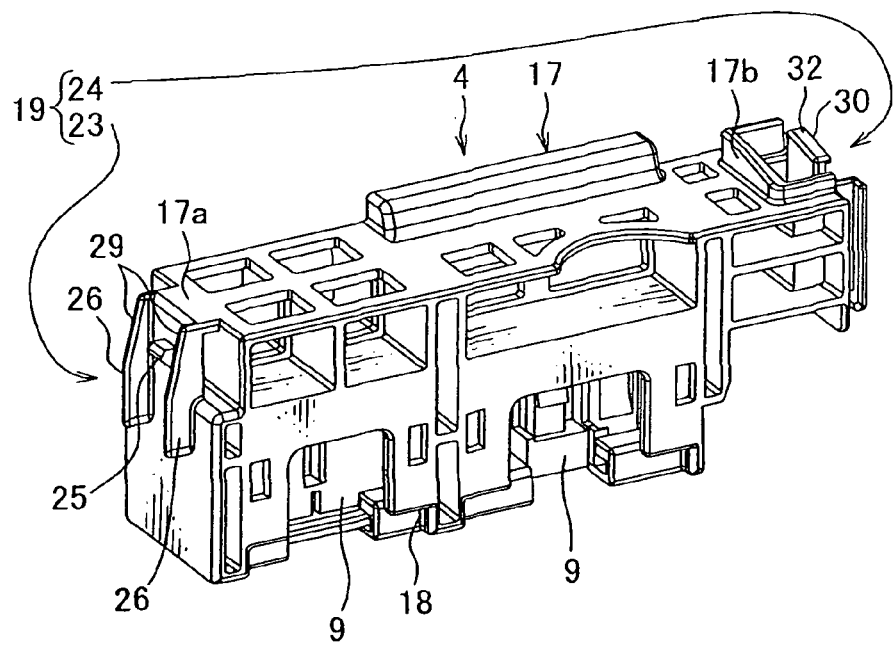
FIG. 7 is another perspective view of the connector cover illustrated in FIG. 5.

Referring to FIGS. 5 to 7, the connector cover 4 includes a box-shaped main body 17, a holding portion 18, and a mounting portion 19. When the connector cover 4 is attached to the body 3, the main body 17 is accommodated in the component accommodation portion 11 and thus in the body 3.

The holding portion 18 continues to the main body 17 adapted to be accommodated in the component accommodation portion 11 at a lower side of the body 3. The holding portion 18 includes a plurality of extended walls 20 extending downward from the main body 17 in parallel with each other (four walls shown in the illustrated example); and hooking walls 21 each continuing to an end of the extended walls 20, the end being a distal end with respect to the main body 17.

The extended walls 20 each include in one piece therewith an engagement arm 22 adapted to be brought into locking engagement with an outer surface of the connector 9. The hooking walls 21 each extend in a direction in which the mutually adjacent pair of the extended walls 20 become close to each other.

The holding portion 18 having the above-described configuration positions the connector 9 between the mutually adjacent two extended walls 20 and between the main body 17 and the hooking wall 21 so that the connector 9 is held thereby. At this point, the engagement arm 22 and the outer surface of the connector 9 are placed in locking engagement with each other, so that the connector 9 is not inadvertently detached from the main body 17.

The mounting portion 19 includes a first mounting portion 23 and a second mounting portion 24. In a state where the main body 17 of the connector cover 4 is accommodated in the component accommodation portion 11 of the body 3, the first mounting portion 23 resides on an outer surface of one end 17a of the main body 17 in its length direction, the one end 17a facing the one locking arm 12.

Figure 8:
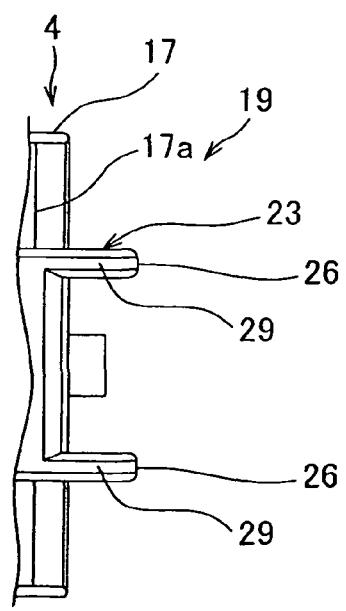
FIG. 8 is a plan view of the first mounting portion of the connector cover illustrated in FIG. 5.

As illustrated in FIG. 8, the first mounting portion 23 includes an engagement projection 25 and a pair of positioning ribs 26.

The engagement projection 25 protrudes from the outer surface of the one end 17a of the main body 17 in its length direction. The engagement projection 25 is adapted, in a state where the main body 17 is accommodated in the component accommodation portion 11, enters the throughhole 14 of the locking arm 12 to be brought into locking engagement with the locking arm 12.

The pair of positioning ribs 26 are provided such that the engagement projection 25 is positioned therebetween, and each have a shape of a protrusion formed on the outer surface of the one end 17a of the main body 17 in its length direction and in a direction orthogonal to the outer surface. The positioning ribs 26 each extend in a straight manner and in parallel with the length direction of the later-described engagement arm 30 of the second mounting portion 24. When the main body 17 is accommodated in the component accommodation portion 11, the positioning ribs 26 only enter the parallel portion 27 of the positioning groove 13 to position the main body 17 (and accordingly the connector cover 4) with respect to the component accommodation portion 11 (and accordingly to the body 3).

Also, a reduced portion 29 in the context of the scope of protection of the present invention is provided at an end of the pair of positioning ribs 26 close to the upper surface of the body 3 and away from the holding portion 18. The amount of protrusion of the reduced portion 29 with reference to the outer surface of the main body 17 decreases as the reduced portion 29 becomes close to the end of the positioning rib 26 on the side of the upper surface and becomes away from the holding portion 18.

When the main body 17 is accommodated in the component accommodation portion 11, the second mounting portion 24 will be found on the outer surface of the other end 17b of the main body 17 facing the other locking arm 12 in the length direction. The second mounting portion 24 includes one engagement arm 30 and a pair of positioning ribs 31.

The engagement arm 30 includes, as illustrated in FIG. 3, an arm main body 32 and a protrusion 33. The arm main body 32 has a shape of a strip, whose one end continues to a lower portion of the outer surface of the other end 17b of the main body 17, and the other end being a free end extending from the one end toward the upper surface. The protrusion 33 is provided at a central portion of the arm main body 32 in a protruding manner. The protrusion 33, when the main body 17 is accommodated in the component accommodation portion 11, enters the throughhole 14 of the locking arm 12 to be brought into locking engagement with the locking arm 12. When the protrusion 33 is brought into locking engagement with the locking arm 12, the other end opposite the free end of the arm main body 32 will protrude closer to the upper surface and accordingly the out of the body 3 than the tip on the side of the upper surface of the locking arm 12.

The pair of positioning ribs 31 are provided such that the engagement arm 30 is positioned therebetween, and each extend in a straight manner and in parallel with the length direction of the engagement arm 30.

The positioning ribs 31 each include in one piece therewith an orthogonal protruding portion 34 and a parallel protruding portion 35. The orthogonal protruding portion 34 protrudes from the outer surface of the other end 17b of the main body 17 in its length direction and extending in a direction orthogonal to the outer surface, and is configured to enter the parallel portion 27. The parallel protruding portion 35 continues to the tip of the orthogonal protruding portion 34 and extends in a direction in which the pair of positioning ribs 31 becomes away from each other, and in parallel with the outer surface, and is configured to enter the spaced-apart portion 28. When the main body 17 is accommodated in the component accommodation portion 11, the positioning rib 31 enters the positioning groove 13 and positions the main body 17, and positions, by virtue of positioning of the main body 17, the connector cover 4 with respect to the component accommodation portion 11 and thus with respect to the body 3.

The connector cover 4 having the above-described configuration is used in the following manner as the electrical junction box 2 is assembled into a finished product.

Figure 9:
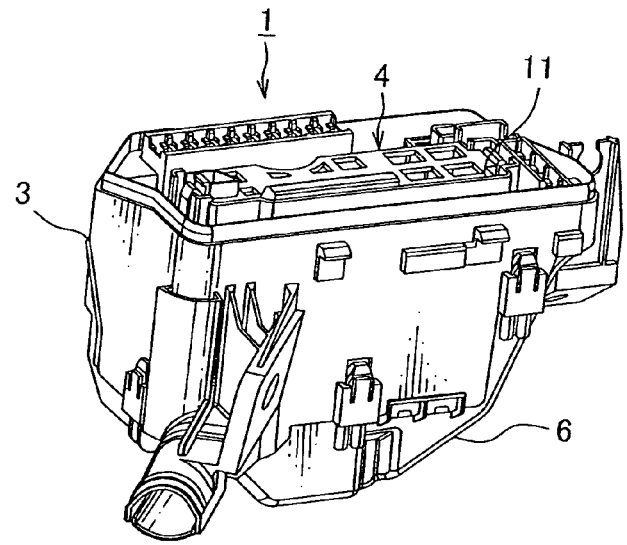
FIG. 9 is a perspective view of the junction box unit illustrated in FIG. 1.

First, as illustrated in FIG. 9, in a state where the connector 9 to be attached to the power integration unit 5 is held by the holding portion 18, the connector cover 4 is accommodated in the component accommodation portion 11 to be attached to the body 3, and in this state conveyed as the junction box unit 1 to the automotive assembly line. At this point, as illustrated in FIG. 3, the engagement projection 25 is in locking engagement with one of the locking arms 12, the protrusion 33 of the engagement arm 30 is in locking engagement with the other of the locking arms 12, and thus the connector cover 4 is secured to the body 3. Here, it is appreciated that the positioning ribs 26 and 31 reside in the positioning groove 13.

Also, on the automotive assembly line, the other end of the engagement arm 30 protruding closer to the protrusion 33 of the arm main body 32 is moved close to the main body 17, so that the locking engagement with the other locking arm 12 of the engagement arm 30 is exited. Further, the connector cover 4 is rotated about one end 17a of the main body 17, taken out of the component accommodation portion 11, and detached from the body 3 as illustrated in FIG. 10. Here, it is appreciated that the connector 9 held by the holding portion 18 is taken out of the body 3 in conjunction with the connector cover 4. Also, the connector 9 is detached from the connector cover 4, and these connectors 9 are attached to the power integration unit 5 as illustrated in FIG. 11.

Figure 12:
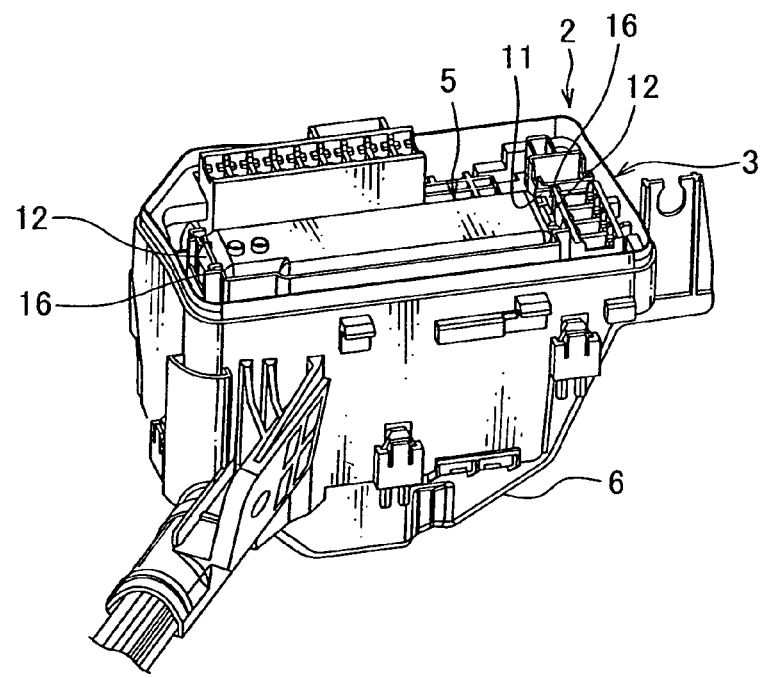
FIG. 12 is a perspective view of the power integration unit illustrated in FIG. 11 that is attached to the body.

Further, as illustrated in FIG. 12, the power integration unit 5 is accommodated in the component accommodation portion 11 to be attached to the body 3. After that, the upper cover is attached to the electrical junction box 2, the electrical junction box 2 is assembled into the finished product, and then mounted in the automobile.

In this manner, the electrical junction box 2 that has been assembled and mounted in the automobile distributes the electrical power from the automobile's power source via the relay 7, fuse 36, and power integration unit 5, to the electronic components of the automobile.

According to this embodiment, the mounting portion 19 includes the engagement projection 25 protruding from the one end of the main body 17 and the engagement arm 30 provided at the other end of the main body 17, and the other end of the engagement arm 30 is more outwardly positioned than the locking arm 12 provided on the body 3. By virtue of this configuration, the other end of the engagement arm 30 can be moved in the direction toward the outer surface of the main body 17 to exit the state of locking engagement with the locking arm 12, and the state of locking engagement with the engagement arm 30 is readily exited. Thus, the connector cover 4 can be readily detached from the body 3. Accordingly, the connector cover 4 can be readily detached from the body 3.

Since the one end 17a of the main body 17 where the engagement projection 25 is provided includes the positioning ribs 26, positioning of the connector cover 4 attached to the body 3 can be realized by the positioning ribs 26. Also, since the positioning ribs 26 each include the reduced portion 29 whose degree of protrusion decreases as the reduced portion 29 becomes away from the holding portion 18, it is made possible to prevent the positioning ribs 26 from getting caught by the body 3 as locking engagement of the engagement arm 30 is exited and the connector cover 4 is detached from the body. Thus, the connector cover 4 can be reliably detached from the body 3.

Since the pair of the positioning ribs 26 are provided and the engagement projection 25 is positioned between the pair of the positioning ribs 26, positioning of the connector cover 4 attached to the body 3 can be reliably achieved.

Also, since the junction box unit 1 includes the connector cover 4, the other end of the engagement arm 30 can be readily moved in the direction in which it is taken out of locking engagement with the locking arm 12, the state of locking engagement with the engagement arm 30 can be readily exited, and the connector cover 4 can be readily detached from the body 3.

It should be noted that, in the above-described embodiment, the connector cover 4 is detached from the body 3 and the power integration unit 5 is attached to the body 3 and thus the electrical junction box 2 is assembled. However, the present invention may be configured such that the connector cover 4 remains attached to the body 3 and the power integration unit 5 is not attached to the body 3, and thus the electrical junction box 2 is assembled.

It should be noted that, in the above-described embodiment, the connector cover 4 is configured to hold the connector 9 that is attached to the power integration unit 5 serving as the electric component. However, the present invention may be configured such that the connector cover 4 is configured to hold the connector 9 that is attached to the relay 7 or any other electric component other than the power integration unit 5.

While the exemplary embodiments of the present invention have been described by way of example, it will be appreciated by those skilled in the art may make various modifications in the light of the above teaching and within the scope and spirit of the present invention, and the scope of the invention is to be defined by the claims appended hereto.

That which is claimed is:

1. A connector cover comprising:
a main body sized and dimensioned to be accommodated in a body of an electrical junction box; a holding portion configured to hold a connector of a wiring harness; and a mounting portion configured to be attached to the body of the electrical junction box for mounting of the main body thereto such that positioning of the connector of the wiring harness with respect to the body of the electrical junction box is provided, wherein the mounting portion including comprising: a first mounting portion; and a second mounting portion; and wherein the first mounting portion comprising an engagement projection protruding from an outer surface of one end of the main body and configured to be brought into locking engagement with a locking portion provided on the body of the electrical junction box, the locking portion being configured to secure an electric component intended to be accommodated in the body of the electrical junction box, and a positioning rib protruding from the outer surface of the one end of the main body, extending lengthwise of the engagement arm, the positioning rib including a reduced portion whose degree of protrusion decreases as the reduced portion becomes more spaced from the holding portion, and the second mounting portion comprising an engagement arm including an arm main body having one end and an other end, the one end continuing to an outer surface of an other end of the main body and the other end being a free end, and a protrusion provided at a central portion of the arm main body and configured to be brought into locking engagement with the locking portion of the body of the electrical junction box, wherein, in a state where the protrusion is in locking engagement with the locking portion, the other end of the arm main body is positioned more outwardly of the body than the locking portion, and wherein the connector cover is capable of being detachably attached to the body of the electrical junction box.

2. The connector cover recited in claim 1 further comprising a pair of the positioning ribs such that the engagement projection is provided therebetween.

3. A junction box unit comprising:
(a) a body of an electrical junction box to which an electric component is attached; and
(b) the connector cover of claim 1 the connector cover being configured to be attached to the body and provide positioning of a connector of a wiring harness with respect to the body.

4. A junction box unit comprising:
(a) a body of an electrical junction box to which an electric component is attached; and
(b) the connector cover of claim 2, the connector cover being configured to be attached to the body and provide positioning of a connector of a wiring harness with respect to the body.

5. The connector cover recited in claim 1, wherein during assembly of an article to be assembled, the connector cover in a state where the connector cover is attached to the body of the electrical junction box while holding the connector therewith is configured to be detached from the body of the electrical junction box, and then to be detached from the connector, thereby allowing the connector to attach to a desired electric component being received in the electrical junction box.

6. The connector cover recited in claim 5, when the connector cover is detached from the body of the electrical junction box, the protrusion exits the locking engagement with the locking portion and the other end of the arm main body is moved close to the main body.

7. The connector cover recited in claim 6, wherein the connector cover is detached from the body of the electrical junction box by a rotation of the connector cover about the one end of the main body.

8. A connector cover comprising:
a main body sized and dimensioned to be accommodated in a body of an electrical junction box; a holding portion configured to hold a connector of a wiring harness; and a mounting portion configured to be attached to the body of the electrical junction box for mounting of the main body thereto such that positioning of the connector of the wiring harness with respect to the body of the electrical junction box is provided, wherein the mounting portion comprising: a first mounting portion; and a second mounting portion; and wherein the first mounting portion comprising an engagement projection protruding from an outer surface of one end of the main body and configured to be brought into locking engagement with a locking portion provided on the body of the electrical junction box, the locking portion being configured to secure an electric component intended to be accommodated in the body of the electrical junction box, and the second mounting portion comprising an engagement arm including an arm main body having one end and an other end, the one end continuing to an outer surface of an other end of the main body and the other end being a free end, and a protrusion provided at a central portion of the arm main body and configured to be brought into locking engagement with the locking portion of the body of the electrical junction box, wherein, in a state where the protrusion is in locking engagement with the locking portion, the other end of the arm main body is positioned more outwardly of the body than the locking portion, wherein the connector cover is capable of being detachably attached to the body of the electrical junction box, and wherein during assembly of an article to be assembled, the connector cover in a state where the connector cover is attached to the body of the electrical junction box while holding the connector therewith is configured to be detached from the body of the electrical junction box, and then to be detached from the connector, thereby allowing the connector to attach to a desired electric component being received in the electrical junction box.

* * * * *